US011595047B1

United States Patent
Park et al.

(10) Patent No.: US 11,595,047 B1
(45) Date of Patent: Feb. 28, 2023

(54) APPARATUS AND METHODS FOR A PHASE FREQUENCY DETECTOR WITH A WIDE OPERATIONAL RANGE

(71) Applicant: Ciena Corporation, Hanover, MD (US)

(72) Inventors: YoungJun Park, Ottawa (CA); Sadok Aouini, Gatineau (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/685,474

(22) Filed: Mar. 3, 2022

(51) Int. Cl.
*H03L 7/089* (2006.01)
*H03L 7/081* (2006.01)
*H03L 7/091* (2006.01)

(52) U.S. Cl.
CPC ............ *H03L 7/0891* (2013.01); *H03L 7/081* (2013.01); *H03L 7/091* (2013.01)

(58) Field of Classification Search
CPC ........ H03L 7/0891; H03L 7/081; H03L 7/091
See application file for complete search history.

(56) References Cited

U.S. PATENT DOCUMENTS

| | | | | |
|---|---|---|---|---|
| 4,378,509 A | * | 3/1983 | Hatchett | H03K 5/26 327/39 |
| 4,764,737 A | * | 8/1988 | Kaatz | H03L 7/183 331/10 |
| 4,970,475 A | * | 11/1990 | Gillig | H03D 13/004 331/25 |
| 5,963,059 A | * | 10/1999 | Partovi | H03D 13/004 331/25 |
| 6,002,273 A | * | 12/1999 | Humphreys | H03L 7/0891 327/148 |
| 6,771,096 B1 | * | 8/2004 | Meyers | H03L 7/0891 331/25 |
| 7,042,970 B1 | * | 5/2006 | Keaveney | H03L 7/1976 375/376 |
| 7,092,475 B1 | * | 8/2006 | Huard | H03D 13/004 375/376 |
| 8,604,840 B2 | * | 12/2013 | Ahmadi | H03L 7/1976 327/107 |
| 9,094,025 B1 | * | 7/2015 | Cheng | H03L 7/091 |
| 9,971,378 B1 | * | 5/2018 | Fahim | G06F 1/08 |

(Continued)

FOREIGN PATENT DOCUMENTS

EP    1115198 A2 *  7/2001  ........... H03D 13/004

*Primary Examiner* — Adam D Houston
(74) *Attorney, Agent, or Firm* — Young Basile Hanlon & MacFarlane, P.C.

(57) ABSTRACT

Described herein is a phase frequency detector (PFD) with a wide operational range. The PFD includes a first flip-flop to receive a reference clock and generate a first output signal based on differences between the reference clock and a feedback clock, a second flip-flop to receive the feedback clock and generate a second output signal based on differences between the reference the feedback clocks, a reset processing path connected to the first flip-flop and second flip-flop, the reset processing path having a reset delay to control a pulse width of a reset signal associated with the first flip-flop and second flip-flop, and an output processing path connected to the first flip-flop and second flip-flop, the output processing path having an output delay to control a pulse width of the first output signal and the second output signal, where the reset processing path and the output processing path are delay independent.

20 Claims, 11 Drawing Sheets

(56) References Cited

U.S. PATENT DOCUMENTS

| | | | | |
|---|---|---|---|---|
| 2002/0154722 | A1* | 10/2002 | Djahanshahi | H03L 7/0891 375/375 |
| 2003/0090296 | A1* | 5/2003 | Yoo | H03L 7/0891 327/12 |
| 2003/0132804 | A1* | 7/2003 | Cheah | H03L 7/0896 331/17 |
| 2004/0008088 | A1* | 1/2004 | Da Dalt | H03L 7/0891 331/25 |
| 2004/0061539 | A1* | 4/2004 | Joordens | H03K 5/1252 327/165 |
| 2006/0208803 | A1* | 9/2006 | Chien | H03D 13/004 331/1 A |
| 2008/0129352 | A1* | 6/2008 | Zhang | H03L 7/1976 375/374 |
| 2015/0116016 | A1* | 4/2015 | Salleh | H03L 7/0891 327/157 |
| 2016/0344380 | A1* | 11/2016 | Chang | H03D 13/004 |
| 2017/0163269 | A1* | 6/2017 | Chang | H03L 7/089 |
| 2018/0191359 | A1* | 7/2018 | Petrov | H03L 7/0896 |
| 2021/0184682 | A1* | 6/2021 | Tak | H03L 7/091 |
| 2022/0407525 | A1* | 12/2022 | Mikhael | H03L 7/0893 |

* cited by examiner

APPARATUS AND METHODS FOR A PHASE FREQUENCY DETECTOR WITH A WIDE OPERATIONAL RANGE

TECHNICAL FIELD

This disclosure relates to phase frequency detectors (PFDs). More specifically, this disclosure relates to a PFD with a wide operational range.

BACKGROUND

Phase frequency detectors (PFDs) are widely used in a variety of electronic applications and circuits including, but not limited to, telecommunications, computers, clock and data recovery circuits, frequency synthesizers, and analog-to-digital convertors. PFDs are also used in phase locked loops (PLLs). PFDs measure phase and frequency differences between two signals, for example, a reference signal and feedback signal from a controlled oscillator in the PLL. PFDs output UP and DOWN signals, which are generated based on the phase and frequency difference between the reference signal and the feedback signal.

An issue with PFDs is the presence of a dead zone, which is the minimum difference in phase between the reference signal and the feedback signal that cannot be detected by the PFD. That is, the PFD fails to detect the phase error when the phase difference reaches a certain small value, which makes the feedback loop essentially open and increase the phase error of the PLL. A technique for overcoming the dead zone is inserting a delay in the PFD to generate a wider PFD output signal. However, this also increases the width of a reset pulse, which results in the PFD missing detection of the reference signal or the feedback signal during the reset pulse. Thus, this reduces the operational range of the PFD.

SUMMARY

Described herein are apparatus and methods for a phase frequency detector (PFD) with wider operational range.

In some implementations, a PFD can include a first flip-flop configured to receive a reference signal and generate a first output signal based on differences between the reference clock and a feedback clock, a second flip-flop configured to receive the feedback clock and generate a second output signal based on differences between the reference clock and the feedback clock, a reset processing path connected to the first flip-flop and the second flip-flop, the reset processing path having a reset delay to control a pulse width of a reset signal associated with the first flip-flop and the second flip-flop, and an output processing path connected to the first flip-flop and the second flip-flop, the output processing path having an output delay to control a pulse width of the first output signal and the second output signal, where the reset processing path and the output processing path are delay independent.

In some implementations, a phase locked loop (PLL) includes a phase frequency detector (PFD) configured to output a first pulse and a second pulse based on differences between a reference clock and a feedback clock. The PFD includes a first multistate circuit configured to receive the reference clock and generate the first pulse, a second multistate circuit configured to receive the feedback clock and generate the second pulse, a reset path configured to control a pulse width of a signal for resetting the first multistate circuit and the second multistate circuit when the first pulse and the second pulse are both high, and an overlap path configured to control a pulse width of the first pulse and the second pulse, where the reset path and the overlap path have independently configurable delays.

In some implementations, a method for improved operational range of a phase frequency detector (PFD) includes providing, in the PFD, a reset processing path with a first delay configured to minimize a reset signal pulse width and providing, in the PFD, an output processing path with a second delay configured to control an output signal pulse width based on dead zone mitigation, where the first delay and the second delay are independently configurable.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
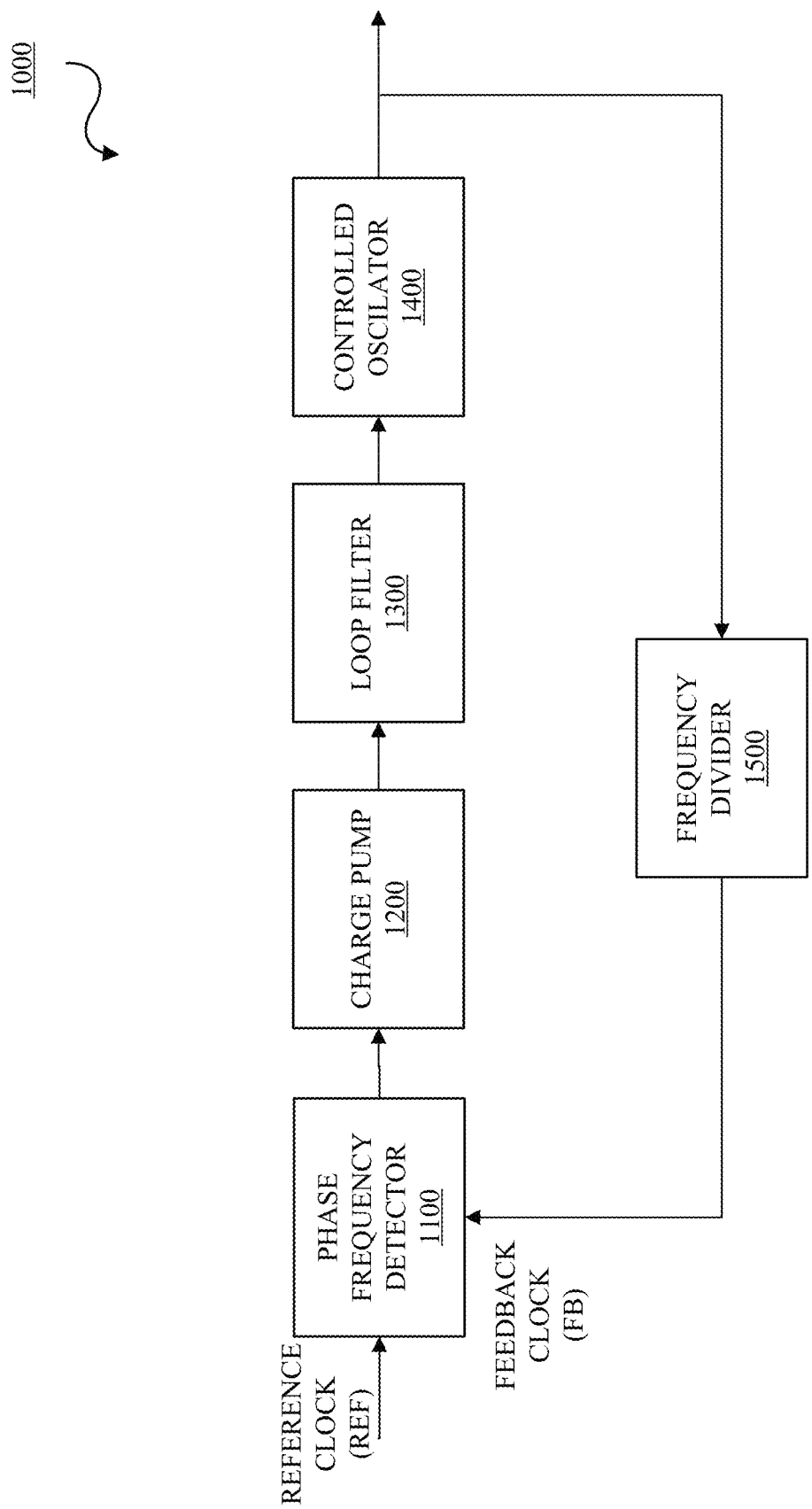
FIG. 1 is a block diagram of an example of a phase locked loop.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, and methods. Those of ordinary skill may thus recognize that other elements and/or steps may be desirable or necessary to implement the devices, systems, and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

FIG. 1 is a block diagram of an example of a phase locked loop (PLL) 1000. The PLL 1000 includes a phase frequency detector (PFD), which has an input connected to a reference clock or signal and an output connected to a charge pump 1200. The output of the charge pump 1200 is connected to a loop filter 1300. The output of the loop filter 1300 is connected to a controlled oscillator (CO) 1400. An output clock or signal of the CO 1400 is the output of the PLL 1000 and is also coupled back as a second input to the PFD 1100 as a feedback clock or signal via a divider 1500. Those of ordinary skill may recognize that other elements may be desirable or necessary to implement the PLL described herein. However, such elements are well known in the art, and because they do not facilitate a better understanding of the disclosed embodiments, a discussion of such elements may not be provided herein.

Operationally, the PFD 1100 detects both phase and frequency differences between the reference clock and the feedback clock. The PFD 1100 generates UP and DOWN pulses whose width is proportional to the phase difference. The UP and DOWN pulses drive the charge pump 1200. The output of the charge pump 1200 is filtered by the loop filter 1300 and applied to a control input of the CO 1400 to produce the target output clock. The output clock is divided by the frequency divider 1500 to generate the feedback clock, which is input to the PFD 1100 to close the feedback loop of the PLL 1000.

Figure 2:
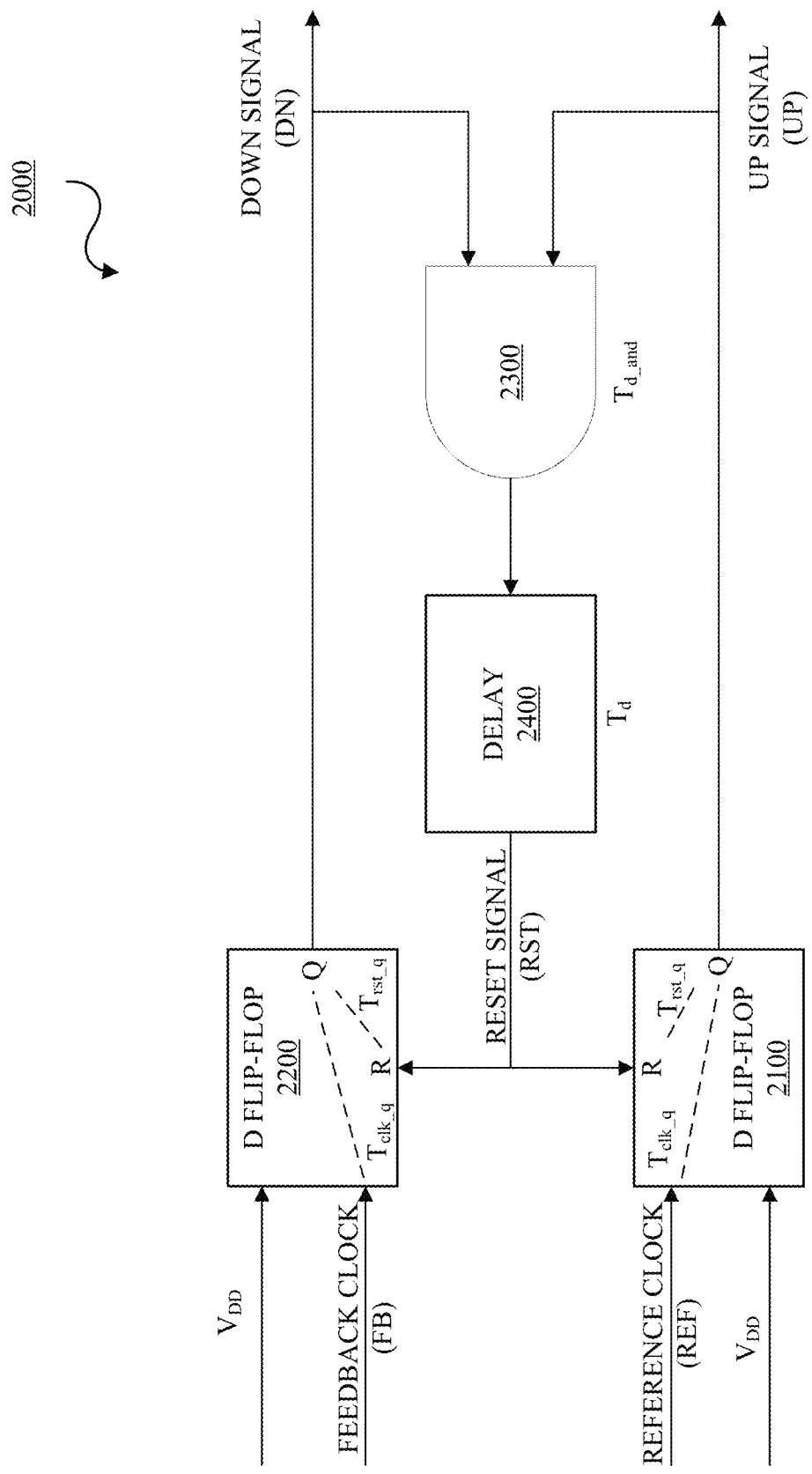
FIG. 2 is a block diagram of an example of a phase frequency detector (PFD).
Figure 3:
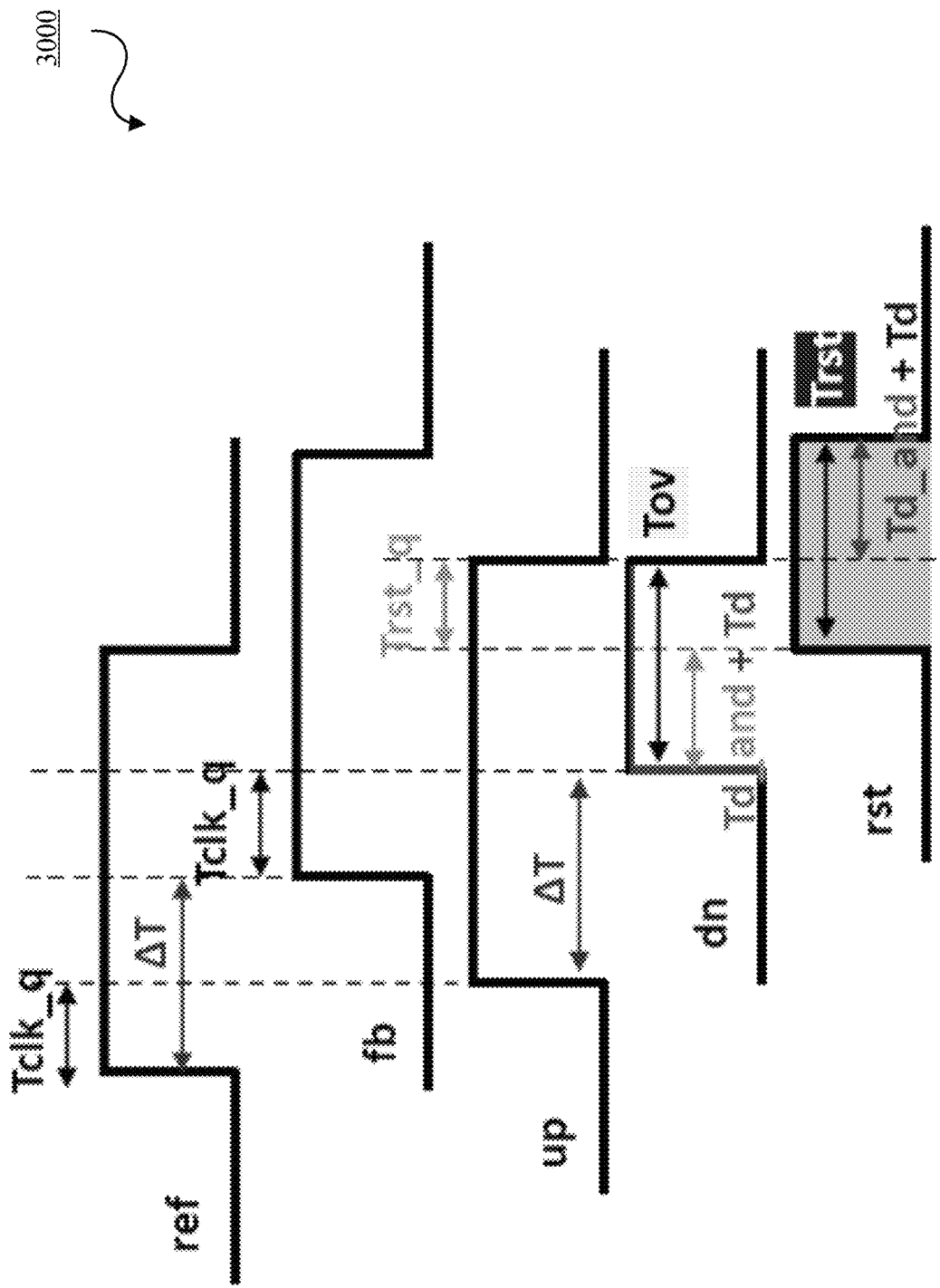
FIG. 3 is a timing diagram for the PFD of FIG. 2.
Figure 4:
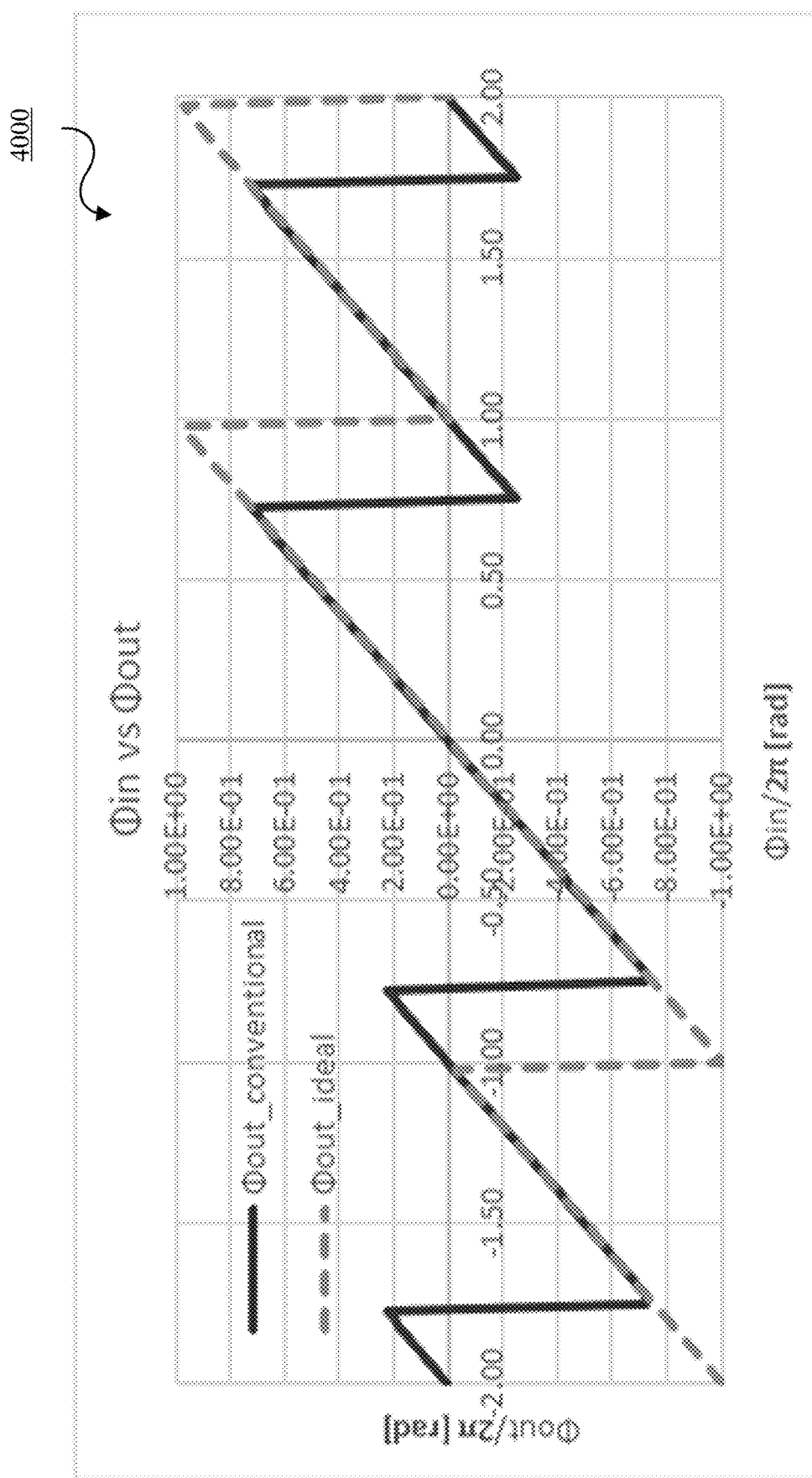
FIG. 4 are phase difference diagrams for the PFD of FIG. 2 and an ideal PFD.
Figure 5:
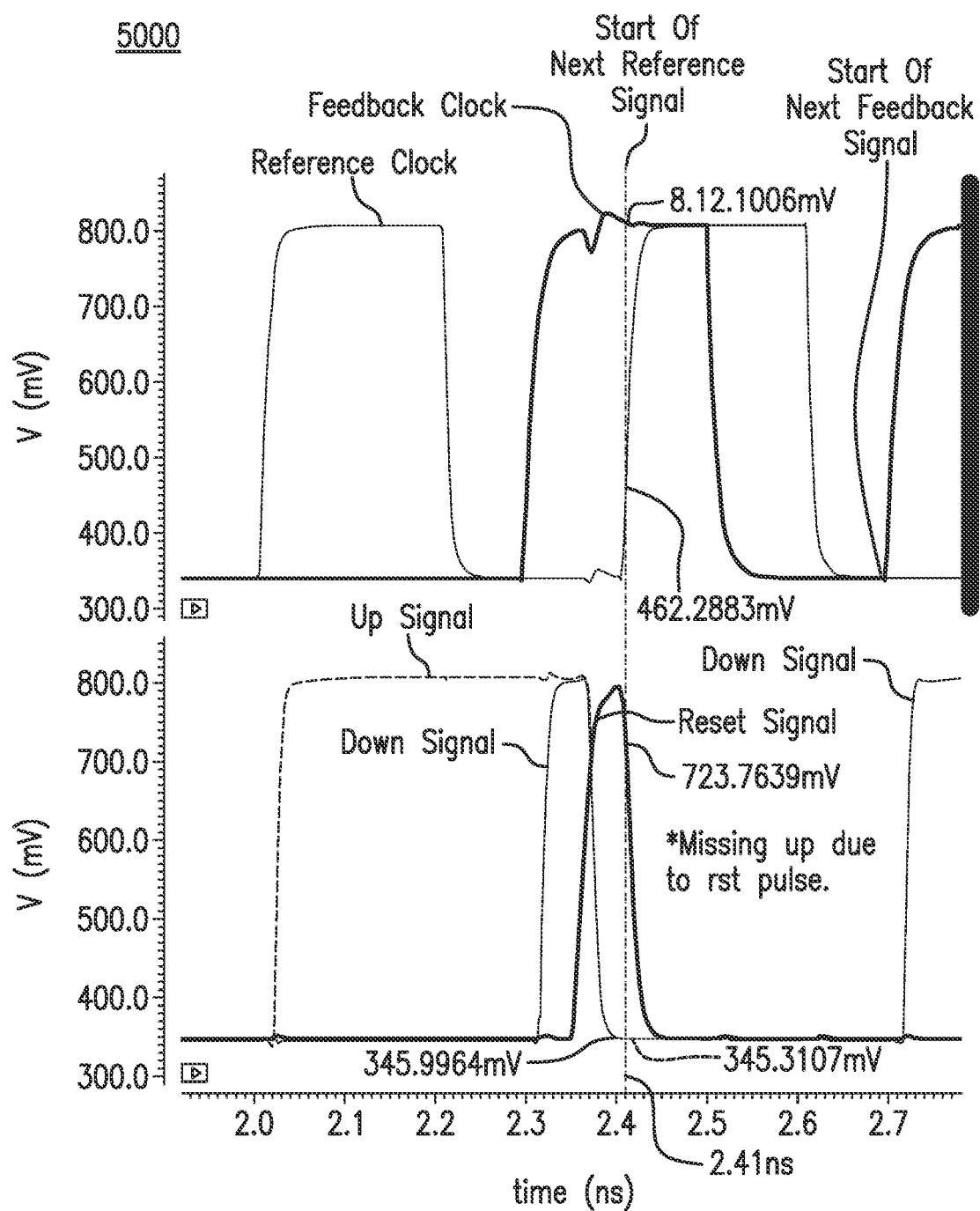
FIG. 5 are signal waveforms for the PFD of FIG. 2.

FIG. 2 is a block diagram of an example of a 3 state phase frequency detector (PFD) 2000, FIG. 3 is a timing diagram for the PFD of FIG. 2, FIG. 4 are phase difference diagrams for the PFD of FIG. 2 and an ideal PFD, and FIG. 5 are signal waveforms for the PFD of FIG. 2.

The PFD 2000 includes a pair of D flip flops (DFFs) 2100 and 2200. In implementations, the pair of DFFs 2100 and 2200 are edge-triggered resettable DFFs. The DFF 2100 has a clock input tied to a reference clock and a data input tied to $V_{DD}$. The DFF 2200 has a clock input tied to a feedback clock and a data input tied to $V_{DD}$. An output (Q) of the DFF 2100 and an output (Q) of the DFF 2200 are connected to, for example, a charge pump in the PLL (as shown in FIG. 1) and connected to an AND gate 2300. The control inputs or resets (R) of the DFFs 2100 and 2200 are tied together and are connected to an output of the AND gate 2300 via a delay 2400. The AND gate 2300 provides a reset path when both outputs, UP and DOWN, go high at the same time. The delay 2400 is included to address the dead zone issue described herein. Those of ordinary skill may recognize that other elements may be desirable or necessary to implement the PFD described herein. However, because such elements are well known in the art, and because they do not facilitate a better understanding of the disclosed embodiments, a discussion of such elements may not be provided herein.

The example operational description for FIG. 2 is with respect to the reference clock leading the feedback clock. In this instance, the PFD 2000 generates an UP signal first and then a DOWN signal.

Operationally, as illustrated in the timing diagrams 3000 FIG. 3, the PFD 2000 generates an UP signal based on the phase difference between the reference clock and feedback clock a time $T_{clk\_q}$ after receiving the reference clock at the DFF 2100. The PFD 2000 generates a DOWN signal based on the phase difference between the reference clock and feedback clock a time $T_{clk\_q}$ after receiving the feedback clock at the DFF 2200 after a time interval $\Delta T$. Therefore, for an output generation path, overlap period (i.e., reference to when both the UP and DOWN signals can be high at the same time), or dead zone mitigation path (i.e., reference to use of a delay period ($T_d$)), $T_{ow}$, the time period is equal to $T_{d\_and}+T_d+T_{rst\_q}$. As stated, the AND gate 2300 prevents both DFFs 2100 and 2200 to be high at the same time. When both the UP and DOWN signals are high, a reset signal (RST) is generated or triggered after a time $T_{d\_and}+T_d$. The generated reset signals make UP and DOWN signals low after $T_{rst\_q}$ then travel through the AND gate 2300 and the delay 2400 and received at the DFF 2100 and the DFF 2200 after a time $T_{d\_and}+T_d$. Therefore, for a reset path or a reset signal width, $T_{rst}$, the time period is equal to $T_{rst\_q} T_{d\_and}+T_d$.

The phase characteristics 4000 of the PFD 2000 versus an ideal PFD are shown in FIG. 4. In FIG. 4, $\Phi_{in}$ (X-axis) is the phase difference between the reference clock and the feedback clock, and $\Phi_{out}$ (Y-axis) is the phase difference between the UP and DOWN signals. Since $\Phi_{in}$ and $\Phi_{out}$ have phase information, $\Phi_{in}$ and $\Phi_{out}$ repeat every $2\pi$. If $\Phi_{out}$ is positive, it means that the reference frequency is faster than the feedback frequency and vice versa. The dashed line in FIG. 4 shows the ideal characteristic of a 3-state PFD. However, a conventional 3-state PFD characteristic (solid line), e.g., PFD 2000, shows a negative phase error even when the input phase difference is positive due to missing information of the UP signal during a reset of the DFF. This missing information can be seen in the signal diagrams 5000 shown in FIG. 5. As stated, a leading edge of a reference clock triggers generation of an UP signal. This is followed by a leading edge of a feedback clock triggering generation of a DOWN signal. A reset signal is generated when both the UP and DOWN signal are high. During a time period or width of the reset signal, the DFF 2100 does not process the reference clock. Therefore, the leading edge of the next reference clock is missed by the DFF 2100 and no UP signal is generated. The leading edge of the next feedback clock is detected, which generates the DOWN signal. This leads to the negative phase error even when the input phase difference is positive. If the positive and the negative areas are the same, then the 3 state PFD can't do frequency detection since the average of the output information will be zero. Therefore, the operational range of 3 state PFD needs to be greater than 50% of the reference period for frequency detection. To increase the operational range of the 3 state PFD, the pulse width of reset signal, i.e., $T_{rst}$, needs to be decreased. However, decreasing the $T_{rst}$ also reduces the $T_{ov}$. But the $T_{ov}$ is needed to avoid the dead zone in the 3 state PFD. That is, $T_{ov}$ is needed to generate a wide enough output pulse, i.e., the UP and DOWN signals, to drive the charge pump which in turn controls the controlled oscillator.

Described herein are devices, circuits, and methods for decoupling a reset signal path and an overlap pulse generation, overlay, or dead zone mitigation path in a PFD. That is, the widths of the reset signal period and the overlay period are decoupled to increase an operational range of the PFD without affecting the dead zone mitigation hardware or circuitry. In other words, a delay associated with reset processing can be minimized or eliminated without affecting a delay associated with dead zone mitigation processing. Otherwise stated, the reset signal path and the pulse generation path are delay independent notwithstanding delays associated with the DFF itself.

In some implementations, a multiplexor can be used to select whether output signals traversing the reset signal path or the overlap pulse generation path are used for inputting to the DFF reset. When the DFFs are reset and the output signals are both are low, then the output signals traversing the reset signal path are used. Otherwise, the output signals traversing the overlap pulse generation signal path are used.

In some implementations, a PFD can be configured with a reset signal path and an overlap pulse generation path, each path can have different and separate delays or different and independent delays. The reset signal path can have a delay one time period which minimizes the width of the reset signal so as to avoid missing detection of leading edge of the reference clock or feedback clock, as appropriate or applicable. The overlap pulse generation path can have a delay two time period which sets the width of the output signal sufficient to drive the charge pump, as appropriate or applicable. That is, the output signals can be appropriately processed by each path. In some implementations, the value of the delay two time period is greater than the delay one time period. In some implementations, the value of the delay two time period is substantially greater than the delay one time period. In some implementations, the value of the delay one time period is zero. That is, there are no additional delays inserted in the reset signal path.

Figure 6:
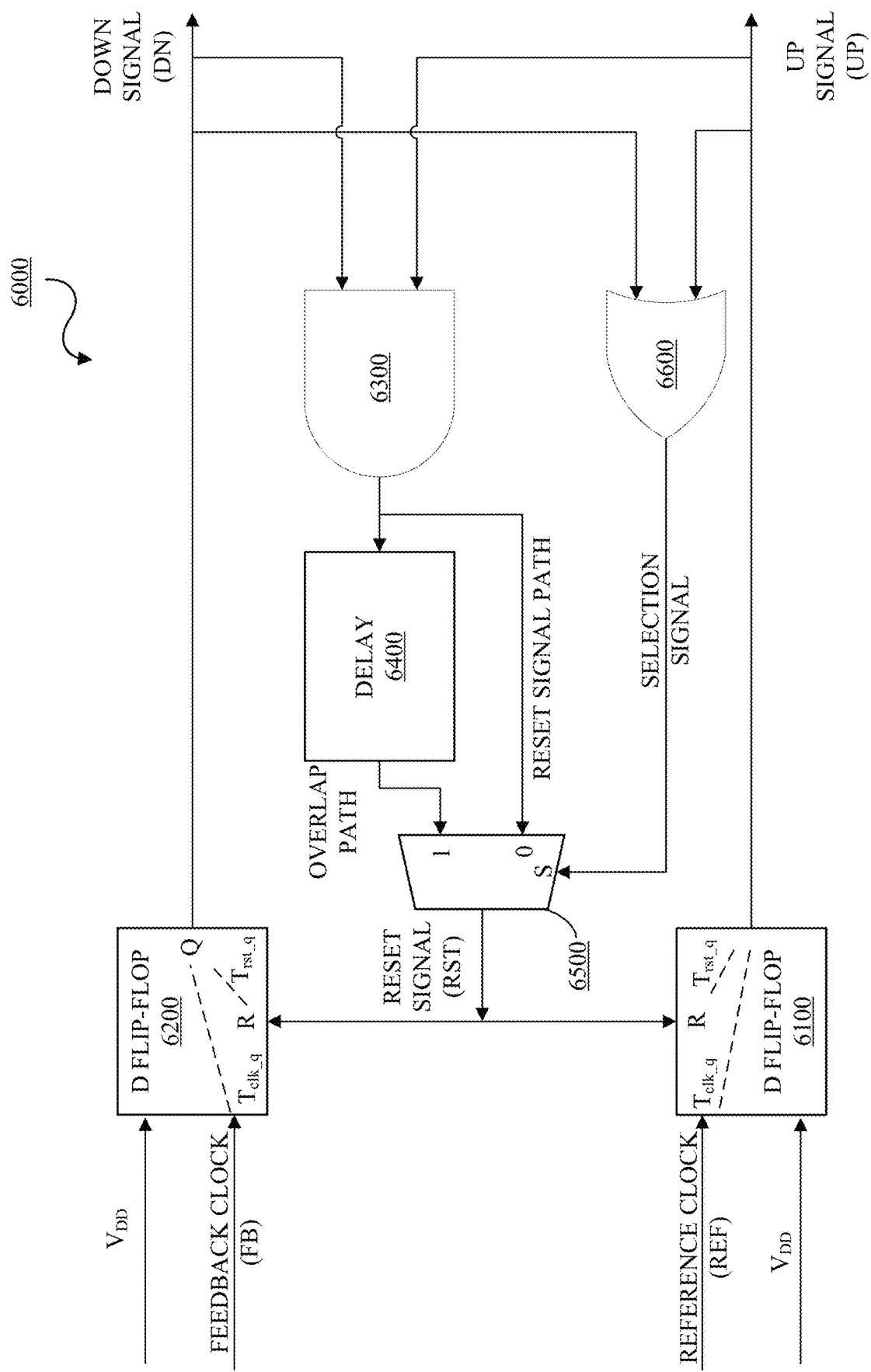
FIG. 6 is a block diagram of an example of a PFD in accordance with embodiments of this disclosure.
Figure 7:
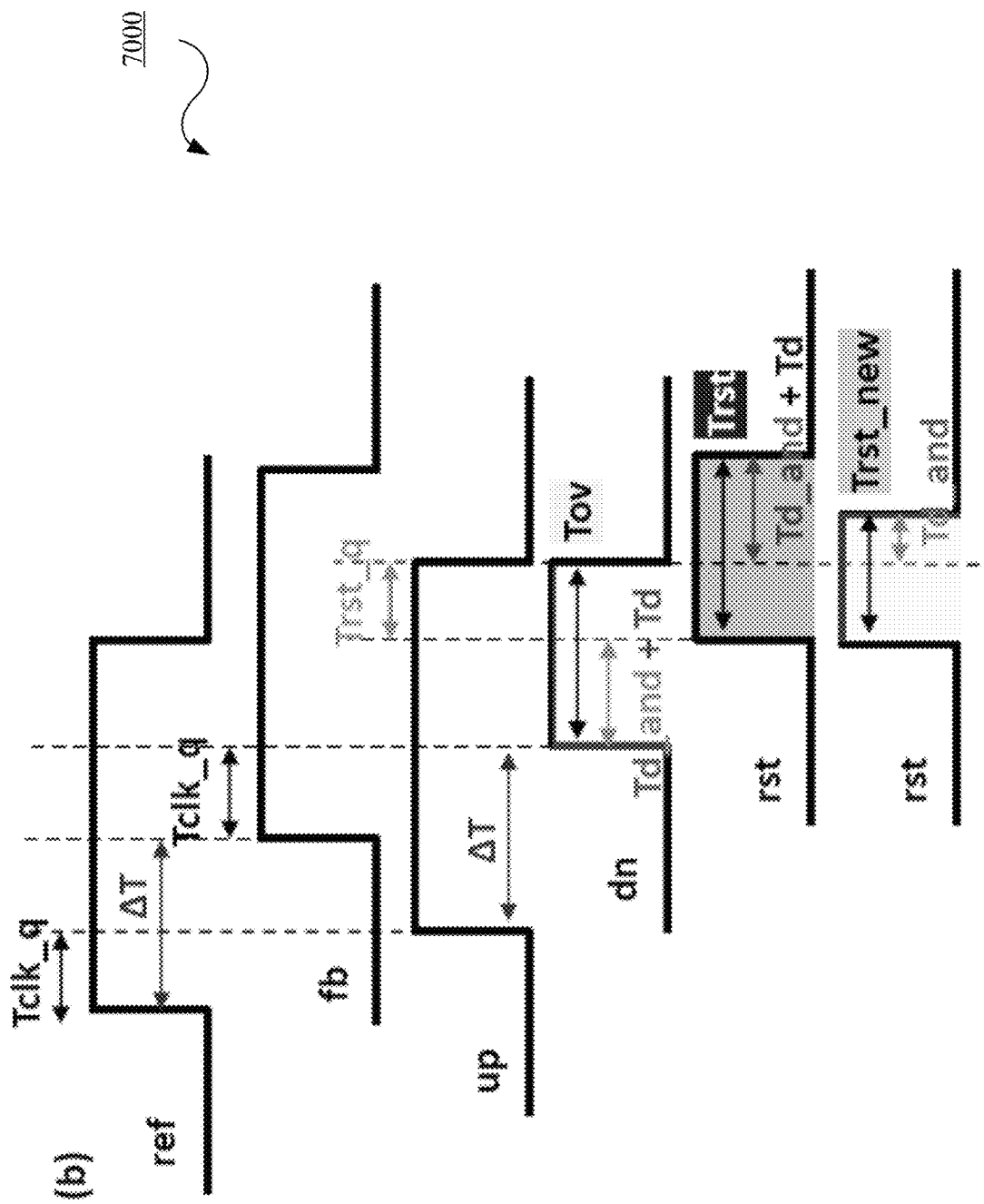
FIG. 7 is a timing diagram for the PFD of FIG. 6 in accordance with embodiments of this disclosure.
Figure 8:
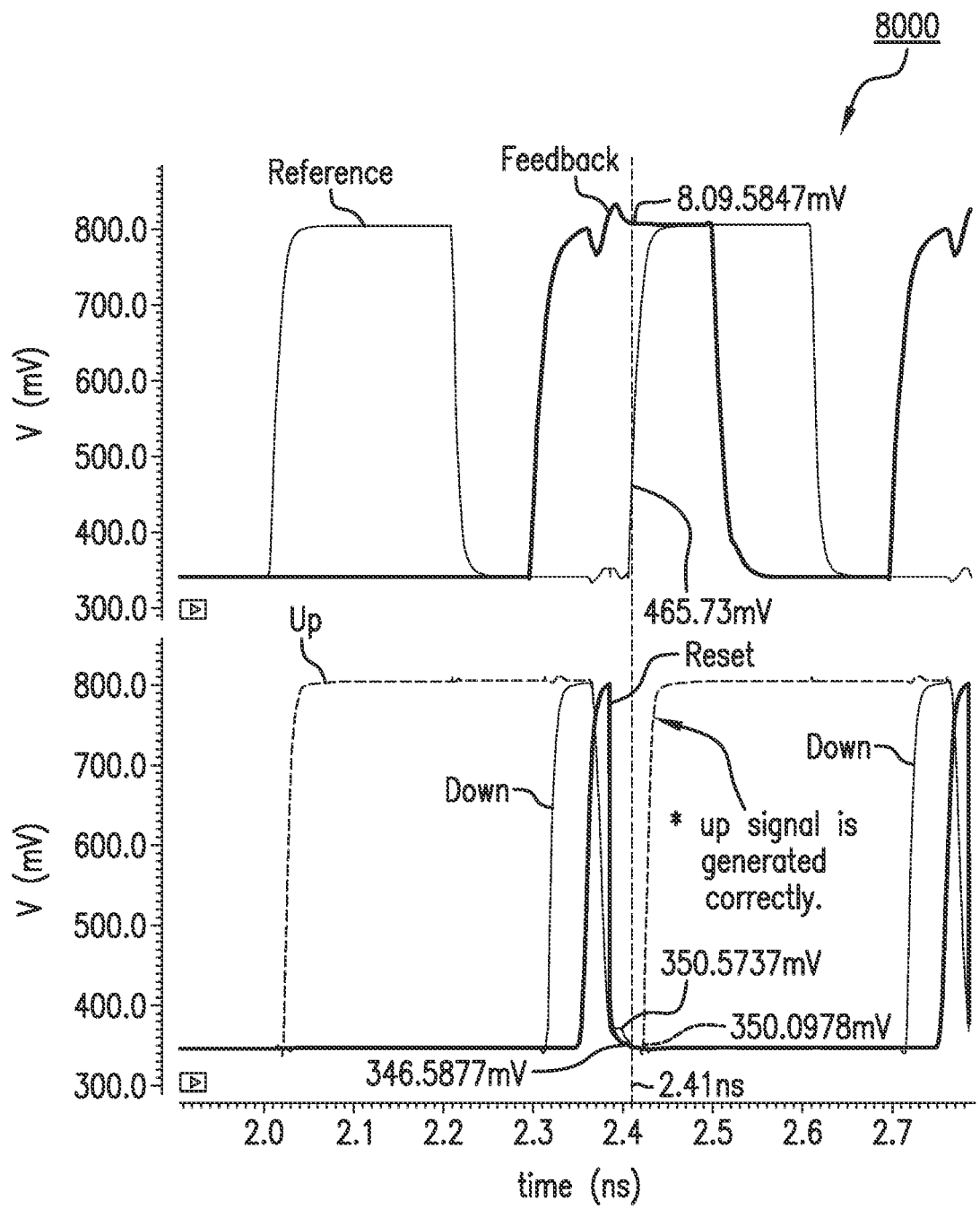
FIG. 8 are signal for the PFD of FIG. 6 in accordance with embodiments of this disclosure.
Figure 9:
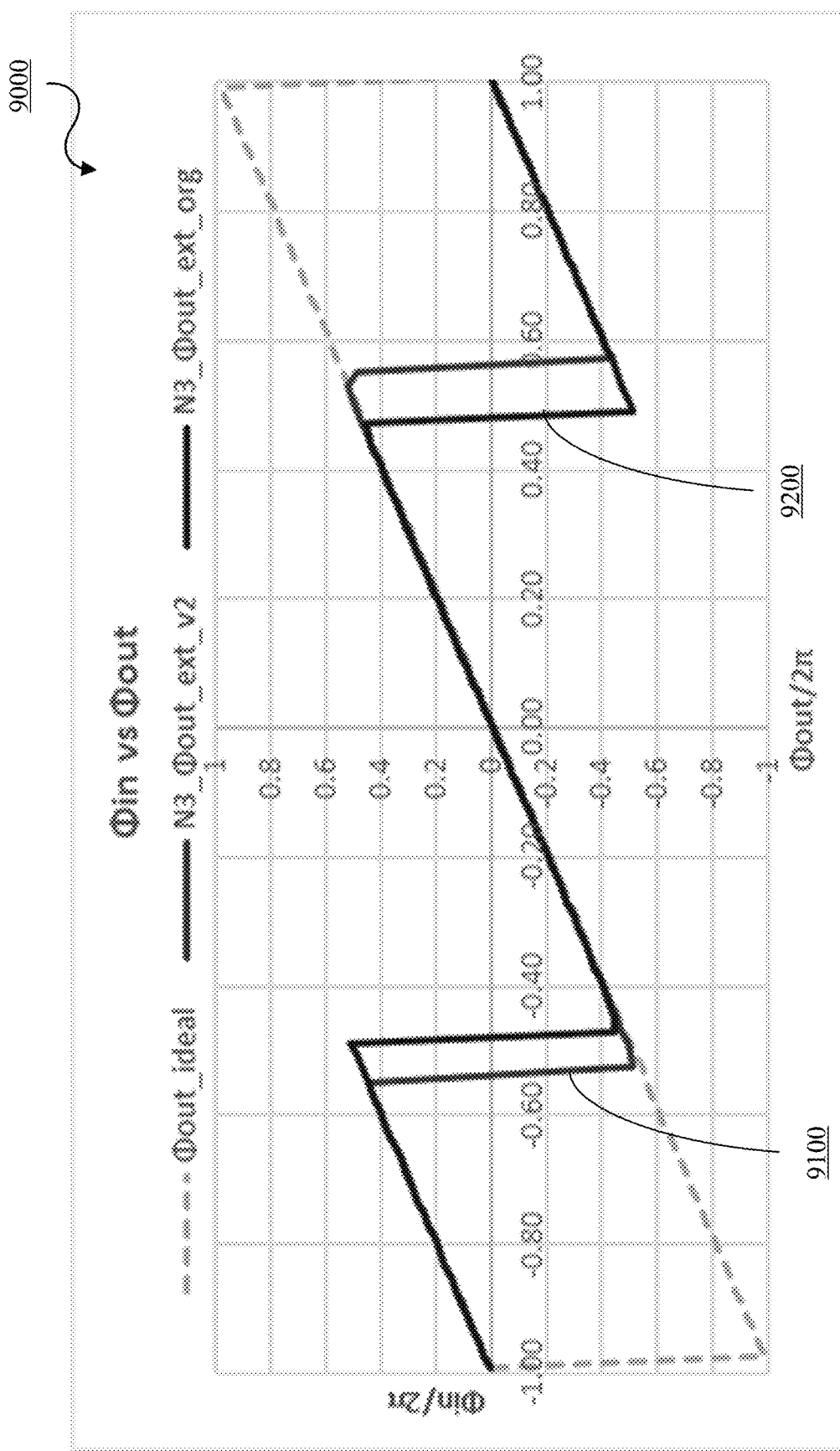
FIG. 9 are phase difference diagrams for the PFD of FIG. 6, the PFD of FIG. 2, and the ideal PFD in accordance with embodiments of this disclosure.

FIG. 6 is a block diagram of an example of a PFD 6000 in accordance with embodiments of this disclosure, FIG. 7 are timing diagrams 7000 for the PFD 6000 in accordance with embodiments of this disclosure, FIG. 8 are signal waveforms 8000 for the PFD 6000 in accordance with embodiments of this disclosure, and FIG. 9 are phase difference diagrams 9000 for the PFD 6000, the PFD 2000 of FIG. 2, and the ideal PFD in accordance with embodiments of this disclosure.

The PFD 6000 includes a pair of D flip flops (DFFs) 6100 and 6200. In implementations, the pair of DFFs 6100 and 6200 are edge-triggered resettable DFFs. The DFF 6100 has a clock input tied to a reference clock and a data input tied to $V_{DD}$. The DFF 6200 has a clock input tied to a feedback clock and a data input tied to $V_{DD}$. An output (Q) of the DFF 6100 and an output (Q) of the DFF 6200 are connected to, for example, a charge pump in the PLL (as shown in FIG. 1) and connected to an AND gate 6300. An output of the AND gate 6300 is connected to an input of a delay 6400 and to a first input of a multiplexor 6500. The output of the AND gate 6300 is also connected to a second input of the multiplexor 6500. A select or arbiter input of the multiplexor 6500 is connected to an output of an OR gate 6600, which has one input connected to the output (Q) of the DFF 6100 and another input connected to an output (Q) of the DFF 6200. In some implementations, the first input can be selected when the OR gate outputs a high or 1 signal and the second input can be selected when the OR gate 6600 outputs a low or 0 signal. The resets (R) of the DFFs 6100 and 6200 are tied together and are connected to an output of the multiplexor 6500. Those of ordinary skill may recognize that other elements may be desirable or necessary to implement the PFD described herein. However, because such elements are well known in the art, and because they do not facilitate a better understanding of the disclosed embodiments, a discussion of such elements may not be provided herein.

The example operational description for FIG. 6 is with respect to the reference clock leading the feedback clock. In this instance, the PFD 6000 generates an UP signal first and then a DOWN signal.

The output selection from the multiplexor 6500 based on the OR gate 6600 can perform, for example, in accordance with the truth table shown in Table 1 and as described below:

TABLE 1

| UP | DOWN | OR | MULTIPLEXOR OUTPUT |
| --- | --- | --- | --- |
| 0 | 0 | 0 | $(T_{rst\_q}) + (T_{d\_and})$ |
| 0 | 1 | 1 | $(T_{rst\_q}) + (T_{d\_and} + T_d)$ |
| 1 | 0 | 1 | $(T_{rst\_q}) + (T_{d\_and} + T_d)$ |
| 1 | 1 | 1 | $(T_{rst\_q}) + (T_{d\_and} + T_d)$ |

Operationally, as illustrated in the timing diagrams 7000 of FIG. 7, the PFD 6000 generates an UP signal based on the phase difference between the reference clock and feedback clock a time $T_{clk\_q}$ after receiving the reference clock at the DFF 6100. The PFD 6000 generates a DOWN signal based on the phase difference between the reference clock and feedback clock a time $T_{clk\_q}$ after receiving the feedback clock at the DFF 6200 after a time interval $\Delta T$. The UP and DOWN signals traverse through the AND gate 6300 and the delay 6400 per the overlap path and travel through the AND gate 6300 per the reset signal path. The UP and DOWN signals are also processed through the OR gate 6600. In accordance with the truth table of Table 1, the multiplexor 6500 outputs the UP and DOWN signals which have traversed through the overlap path. In the overlap path, the time period $T_{ov}$ is equal to $T_{d\_and} + T_d \pm T_{rst\_q}$.

As stated, the AND gate 6300 prevents both DFFs 6100 and 6200 to be high at the same time. When both the UP and DOWN signals are high, a reset signal (RST) is generated or triggered after a time $T_{d\_and} + T_d$. These generated reset signals make UP and DOWN signals low after $T_{rst\_q}$. The reset signals traverse through the AND gate 6300 and the delay 6400 per the overlap path and travel through the AND gate 6300 per the reset signal path. The reset signals are also processed through the OR gate 6600. In accordance with the truth table of Table 1, the multiplexor 6500 outputs the reset signals which have traversed through the reset signal path. In this instance, the reset signals are received at the DFF 6100 and the DFF 6200 after a time $T_{d\_and}$. Therefore, for the reset path or a reset signal width, $T_{rst\_new}$, the time period is equal to $T_{rst\_q} + T_{d\_and}$. The $T_{rst\_new}$ has a shorter time period than $T_{rst}$ by a value $T_d$. Since the time period for $T_{rst\_new}$ is shorter than $T_{rst}$, the DFF 6100 (and/or 6200) has a greater opportunity to process a leading edge of the next reference signal. This can be seen in the signal waveforms 8000 of FIG. 8. As stated, a leading edge of a reference clock triggers generation of an UP signal. This is followed by a leading edge of a feedback clock triggering generation of a DOWN signal. A reset signal is generated when both the UP and DOWN signal are high. Since a time period or width of the reset signal is narrower than in the PFD 2000 of FIG. 2, the DFF 6100 does detect the leading edge of the next reference clock and an UP signal is generated. The PFD 6000 operates correctly. Moreover, the time periods for $T_{ov}$ and $T_{rst\_new}$ are delay independent and/or different. The delays in each of the reset signal path and the overlap path can be set without affecting the other path. The time period of the overlap path is larger relative to the time period of the reset signal path for the reasons stated herein for reset signal pulse width and dead zone mitigation.

The phase characteristics 9000 of the PFD 6000 versus an ideal PFD and the PFD 2000 are shown in FIG. 9. As before, $\Phi_{in}$ (X-axis) is the phase difference between the reference clock and the feedback clock, and $\Phi_{out}$ (Y-axis) is the phase difference between the UP and DOWN signals. Since $\Phi_{in}$ and $\Phi_{out}$ have phase information, $\Phi_{in}$ and $\Phi_{out}$ repeat every $2\pi$. If $\Phi_{out}$ is positive, it means that the reference frequency is faster than the feedback frequency and vice versa. The dashed line in FIG. 9 shows the ideal characteristic of a 3 state PFD. A conventional 3 state PFD (e.g., PFD 2000) characteristic is shown as 9100 and a 3 state PFD characteristic for PFD 6000 is shown as 9200. In some implementations, the time period of $T_{rst\_new}$ is approximately 15% less than the time period of $T_{rst}$. This leads to an increase in the operational range by approximately 15%. That is, a PLL lock time is improved by approximately 15%. For example, the conventional 3 state PFD operational range is approximately 47%-48%. The 3 state PFD operational range of PFD 6000 is approximately 53%-57%. This is an approximately 15% improvement. Moreover, the total current is increased from 29.7 mA to 32.6 mA, which is due, in part, to the OR gate 6600.

Figure 10:
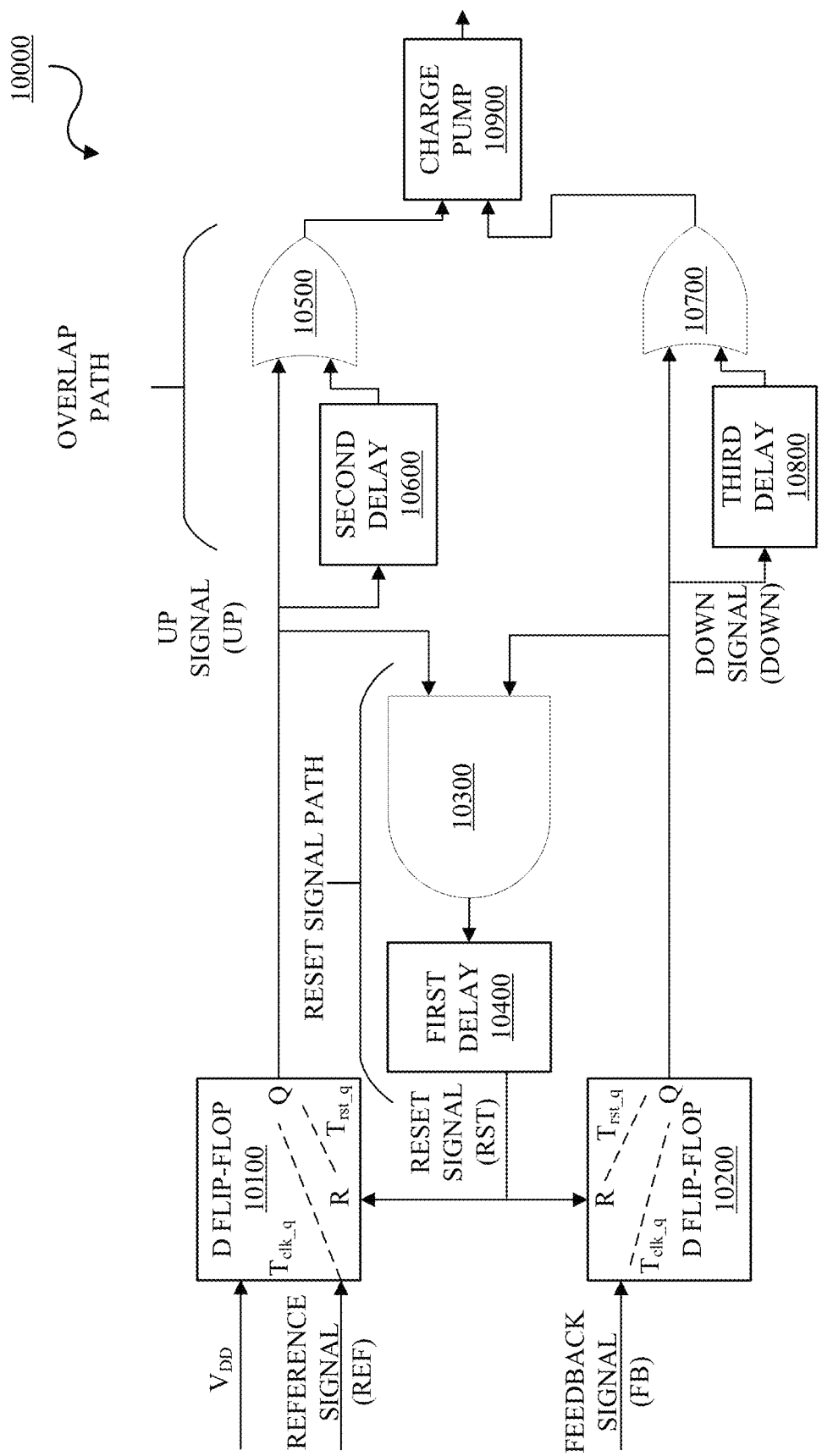
FIG. 10 is a block diagram of an example of a PFD in accordance with embodiments of this disclosure.

FIG. 10 is a block diagram of an example of a PFD 10000 in accordance with embodiments of this disclosure. The PFD 10000 includes a pair of D flip flops (DFFs) 10100 and 10200. In implementations, the pair of DFFs 10100 and 10200 are edge-triggered resettable DFFs. The DFF 10100 has a clock input tied to a reference clock and a data input tied to $V_{DD}$. The DFF 10200 has a clock input tied to a feedback clock and a data input tied to $V_{DD}$. An output (Q) of the DFF 10100 and an output (Q) of the DFF 10200 are connected to an AND gate 10300. The resets (R) of the DFFs 10100 and 10200 are tied together and are connected to an output of the AND gate 10300 via a first delay 10400. The AND gate 10300 provides a reset signal path when both outputs, UP and DOWN, go high at the same time. The first delay 10400 is minimal. In some implementations, the first delay 10400 is zero.

The output (Q) of the DFF 10100 is also connected to a first input of a first OR gate 10500 and a second delay 10600. An output of the second delay 10600 is connected to a second input of the first OR gate 10500. The output (Q) of the DFF 10200 is also connected to a first input of a second OR gate 10700 and a third delay 10800. An output of the third delay 10800 is connected to a second input of the second OR gate 10700. An output of the OR gate 10500 and an output of the OR gate 10700 are connected to a charge pump 10900, which in turn is connected to a remainder of a PLL (for example, as shown in FIG. 1). The delay values for the second delay 10600 and the third delay 10800 are substantially matched. The OR gate 10500 and the second delay 10600 and the OR gate 10700 and the third delay 10800 represent overlay paths for the PFD 10000 as described herein. These overlay paths and the reset signal path can be independently set or configured with respect to delay times as described herein. That is, the delay values for the first delay 10400 are smaller relative to the delay values for the second delay 10600 and the third delay 10800 for the reasons described herein related to reset pulse width and dead zone mitigation. Those of ordinary skill may recognize that other elements may be desirable or necessary to implement the PFD described herein. However, because such elements are well known in the art, and because they do not facilitate a better understanding of the disclosed embodiments, a discussion of such elements may not be provided herein.

The example operational description for FIG. 10 is with respect to the reference clock leading the feedback clock. In this instance, the PFD 10000 generates an UP signal first and then a DOWN signal.

Operationally, the PFD 10000 generates an UP signal based on the phase difference between the reference clock and feedback clock a time $T_{clk\_q}$ after receiving the reference clock at the DFF 10100. The PFD 10000 generates a DOWN signal based on the phase difference between the reference clock and feedback clock a time $T_{clk\_q}$ after receiving the feedback clock at the DFF 10200 after a time interval $\Delta T$. The UP and DOWN signals traverse the OR gate 10500 and the second delay 10600 and the OR gate 10500 and the third delay 10800 and the OR gate 10700, respectively. In this instance, the respective time periods for the overlap paths, $T_{ov\_up}$, and $T_{ov\_dn}$, are $T_{rst\_q} \, T_{d\_second} + T_{or}$ and $T_{rst\_q} \, T_{d\_third} + T_{or}$, respectively.

As stated, the AND gate 10300 prevents both DFFs 10100 and 10200 to be high at the same time. When both the UP and DOWN signals are high, a reset signal (RST) is generated or triggered after a time $T_{d\_and} + T_{d\_first}$. This generated reset signals make UP and DOWN signals low after $T_{rst\_q}$. The reset signals traverse through the AND gate 10300 and the first delay 10400 per the reset signal path. In this instance, the time period for the reset signal path is equal to $T_{rst\_q} \, T_{d\_and} \, T_{d\_first}$. The $T_{rst\_new}$ can have a shorter time period than $T_{rst}$ by minimizing the value of the first delay 10400 or eliminating the first delay 10400. Since the time period for $T_{rst\_new}$ can be shorter than $T_{rst}$ without affect the time period of the overlay path, $T_{ov\_up}$, and $T_{ov\_dn}$, the DFF 10100 (and/or 10200) has a greater opportunity to process a leading edge of the next reference signal (or next feedback signal).

Figure 11:
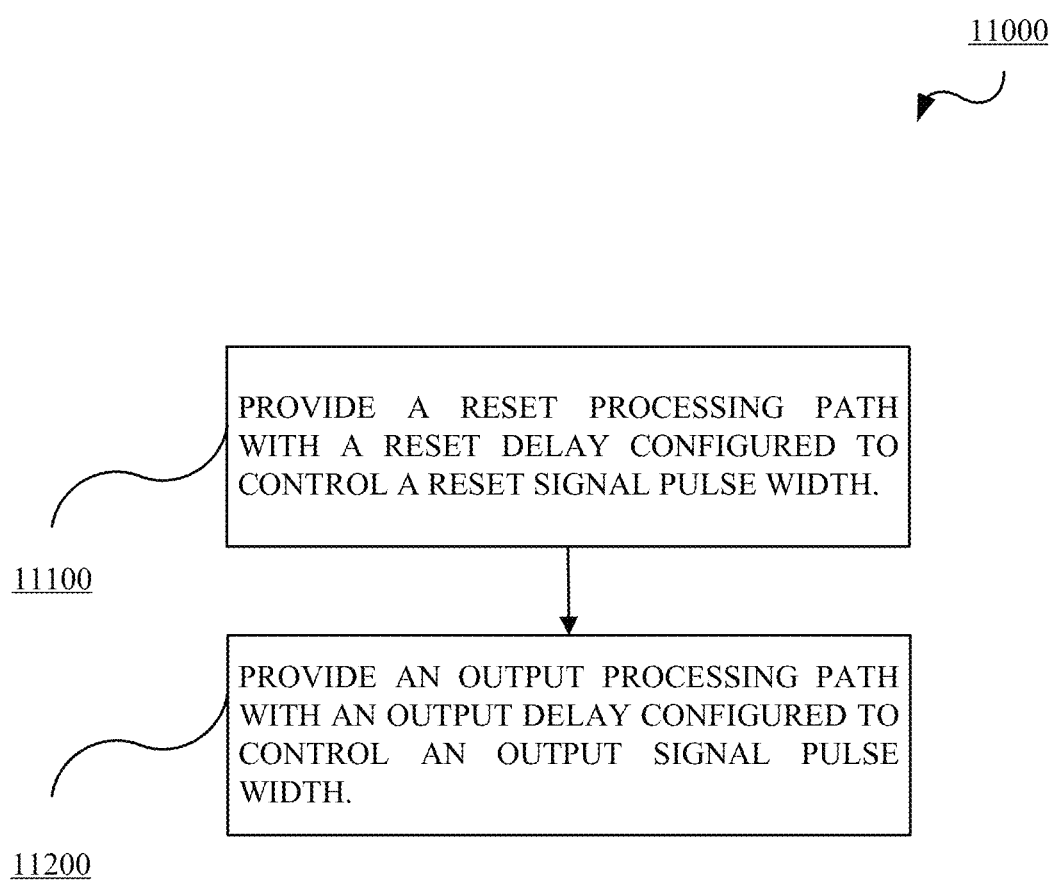
FIG. 11 is a flowchart of an example technique for a PFD with wider operational range in accordance with embodiments of this disclosure.

FIG. 11 is a flowchart of an example method 11000 for a PFD with improved operational range in accordance with embodiments of this disclosure. The method 11000 includes: providing 11100 a reset processing path with a reset delay configured to control a reset signal pulse width; and providing 11200 an output processing path (an overlap pulse generation path) with an output delay configured to control an output signal pulse width. The method 11000 may be implemented, as appropriate and applicable, by the PLL 1000 of FIG. 1, the PFD 6000 of FIG. 6, and the PFD 10000 of FIG. 10.

The method 11000 includes providing 11100 a reset processing path with a reset delay configured to control a reset signal pulse width. In implementations, a PFD includes a pair of multi-state devices, latches, or flip-flops, each connected to the reset processing path and the output processing path. The PFD is configured to output a first output signal, a second output signal, and a reset signal. In the implementation of FIG. 6, the reset delay is not going through the delay 6400. In the implementation of FIG. 10, the reset delay is the first delay 10400.

A PFD addresses both reset signal pulse width and dead zone by decoupling the reset processing path and the output processing path. The reset processing path can include a reset delay with a minimal or zero value to minimize a pulse width of a reset signal so as to detect an input clock or signal at a DFF of the PFD. In some implementations, the reset processing path and the output processing path are decoupled using a multiplexor circuit which enables narrowing a reset pulse width without affecting the output processing path.

The method 11000 includes providing 11200 an output processing path with an output delay configured to control an output signal pulse width. In the implementation of FIG. 6, the output delay is the delay 6400. In the implementation of FIG. 10, the output delay is the second delay 10600 and the third delay 10800. The output processing path includes the output delay with a value to provide a pulse width for the output signal sufficient to mitigate dead zone and drive PLL operation. In some implementations, the reset processing path and the output processing path are decoupled using a multiplexor circuit which enables widening an output signal pulse width without affecting the reset processing path. In some implementations, the output processing path provides the output delay outside of or external to the reset processing path. That is, the reset delay and the output delay are independent and different values set to address different issues, namely, the reset signal pulse width and the output signal pulse width, respectively.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A phase frequency detector (PFD) comprising:
   a first flip-flop configured to receive a reference clock and generate a first output signal based on differences between the reference clock and a feedback clock;
   a second flip-flop configured to receive the feedback clock and generate a second output signal based on differences between the reference clock and the feedback clock;
   a reset processing path connected to the first flip-flop and the second flip-flop, the reset processing path having a reset delay to control a pulse width of a reset signal associated with the first flip-flop and the second flip-flop; and
   an output processing path connected to the first flip-flop and the second flip-flop, the output processing path having an output delay to control a pulse width of the first output signal and the second output signal,
   wherein the reset processing path and the output processing path are delay independent.

2. The PFD of claim 1, wherein a value of the reset delay is smaller than a value of the output delay.

3. The PFD of claim 1, wherein a value of the reset delay is set to minimize the pulse width of the reset signal.

4. The PFD of claim 3, wherein a value of the reset delay is set to zero.

5. The PFD of claim 1, wherein a value of the output delay is set to mitigate a dead zone of the PFD.

6. The PFD of claim 1, further comprising
   a multiplexor connected to reset inputs of the first flip-flop and the second flip-flop;
   a logical AND gate configured to receive the first output signal at one input and the second output signal at another input, wherein the reset processing path is connected between one input of the multiplexor and an output of the logical AND gate and wherein the output processing path is connected between another input of the multiplexor and an output of the reset delay after the logical AND gate; and
   a logical OR gate configured to generate a selection signal for the multiplexor based on the first output signal and the second output signal,
   wherein the multiplexor, based on the selection signal, is configured to output a signal processed through the reset processing path or the output processing path.

7. The PFD of claim 6, wherein the selection signal enables an output from the reset processing path when the first output signal and the second output signal are both low.

8. The PFD of claim 7, wherein the reset signal is generated when the first output signal and the second output signal are both high.

9. The PFD of claim 1, wherein the reset processing path further comprising
   a logical AND gate configured to receive the first output signal at one input and the second output signal at another input; and
   the reset delay connected to an output of the logical AND gate and connected to reset inputs of the first flip-flop and the second flip-flop.

10. The PFD of claim 1, wherein the output delay includes a first output delay and a second output delay and the output processing path further comprising
    a first output processing path including
       the first output delay configured to receive the first output signal; and
       a first logical OR gate configured to receive the first output signal at one input and an output of the first output delay at another input; and
    a second output processing path including
       the second output delay configured to receive the second output signal; and
       a second logical OR gate configured to receive the second output signal at one input and an output of the second output delay at another input,
    wherein the reset delay has a value smaller than a value of the first output delay and a value of the second output delay.

11. The PFD of claim 10, wherein the value of the first output delay and the value of the second output delay are substantially matched.

12. A phase locked loop (PLL) comprising:
    a phase frequency detector (PFD) configured to output a first pulse and a second pulse based on differences between a reference clock and a feedback clock, the PFD including
       a first multistate circuit configured to receive the reference clock and generate the first pulse;
       a second multistate circuit configured to receive the feedback clock and generate the second pulse;
       a reset path configured to control a pulse width of a signal for resetting the first multistate circuit and the second multistate circuit when the first pulse and the second pulse are both high; and
       an overlap path configured to control a pulse width of the first pulse and the second pulse,
       wherein the reset path and the overlap path have independently configurable delays.

13. The PLL of claim 12, wherein a delay associated with the reset path is smaller than a delay associated with the overlap path.

14. The PLL of claim 12, wherein a delay associated with the reset path minimizes the pulse width of the signal to increase a probability of detection of one of the reference clock or the feedback clock.

15. The PLL of claim 12, wherein a delay associated with the overlap path mitigates dead zone operation of the PFD and a delay associated with the reset path is smaller than the delay associated with the overlap path.

16. The PLL of claim 15, wherein the delay associated with the reset path is zero.

17. The PLL of claim 12, wherein the PFD further comprising a multiplexor connected to control inputs of the first multistate circuit and the second multistate circuit;

a logical AND gate configured to receive the first pulse at one input and the second pulse at another input;

the reset path between one input of the multiplexor and an output of the logical AND gate;

the output path between another input of the multiplexor and the output of a delay after the logical AND gate; and a logical OR gate configured to generate a signal to the multiplexor to select an output from the reset path or the output path based on the first pulse and the second pulse.

18. The PLL of claim 17, wherein the signal enables the reset path when the first pulse and the second pulse are both low.

19. The PLL of claim 12, wherein
the reset path further comprising
a logical AND gate configured to receive the first pulse at one input and the second pulse at another input; and
a first delay connected to an output of the logical AND gate and connected to reset inputs of the first multistate circuit and the second multistate circuit and the output path further comprising
a first output processing path including
a second delay configured to receive the first pulse; and
a first logical OR gate configured to receive the first pulse at one input and an output of the second delay at another input; and
a second output processing path including
a third delay configured to receive the second pulse; and
a second logical OR gate configured to receive the second pulse at one input and an output of the third delay at another input,
wherein the first delay has a value smaller than a value of the second delay and a value of the third delay.

20. A method for improved operational range of a phase frequency detector (PFD), the method comprising:
providing, in the PED, a reset processing path with a first delay configured to minimize a reset signal pulse width; and
providing, in the PFD, an output processing path with a second delay configured to control an output signal pulse width based on dead zone mitigation,
wherein the first delay and the second delay are independently configurable.

* * * * *